(12) United States Patent
Lim et al.

(10) Patent No.: US 8,399,279 B2
(45) Date of Patent: Mar. 19, 2013

(54) FABRICATION METHOD OF CARBON NANOTUBE FILM AND SENSOR BASED ON CARBON NANOTUBE FILM

(75) Inventors: Geunbae Lim, Pohang-si (KR); Taechang An, Pohang (KR)

(73) Assignee: Postech Academy-Industry Foundation, Pohang (KR)

(*) Notice: Subject to any disclaimer, the term of this patent is extended or adjusted under 35 U.S.C. 154(b) by 0 days.

(21) Appl. No.: 13/176,019

(22) Filed: Jul. 5, 2011

(65) Prior Publication Data

US 2012/0025330 A1 Feb. 2, 2012

(30) Foreign Application Priority Data

Jul. 30, 2010 (KR) .................. 10-2010-0074182

(51) Int. Cl.
*H01L 21/02* (2006.01)
(52) U.S. Cl. ........ 438/52; 438/48; 438/50; 257/E21.002
(58) Field of Classification Search .............. 438/52
See application file for complete search history.

(56) References Cited

U.S. PATENT DOCUMENTS

| | | | |
|---|---|---|---|
| 6,297,063 B1* | 10/2001 | Brown et al. ............... | 438/2 |
| 6,803,840 B2* | 10/2004 | Hunt et al. ................. | 333/186 |
| 2006/0158760 A1* | 7/2006 | Portico Ambrosio et al. ............... | 359/883 |
| 2006/0226550 A1* | 10/2006 | Dai et al. .................. | 257/763 |
| 2007/0059947 A1* | 3/2007 | Moriya et al. ............ | 438/780 |
| 2007/0200187 A1 | 8/2007 | Amlani | |
| 2009/0130386 A1* | 5/2009 | Golovchenko et al. ..... | 428/138 |
| 2010/0032653 A1* | 2/2010 | Takeda et al. ............. | 257/24 |
| 2010/0289509 A1* | 11/2010 | Chung et al. ............. | 324/692 |

FOREIGN PATENT DOCUMENTS

| | | |
|---|---|---|
| KR | 10-2007-0104809 | 10/2007 |
| KR | 10-2009-0001379 | 1/2009 |
| KR | 10-2010-0016766 | 2/2010 |

OTHER PUBLICATIONS

Taechang an, et al., "Real-time, step-wise, electrical detection of protein molecules using dielectrophoretically aligned SWNT-film FET aptasensors", Lab on a Chip, vol. 10, No. 16, Aug. 21, 2010, pp. 2052-2056. <http://pubs.rsc.org/en/Content/ArticleLanding/2010/LC/C005276K>

* cited by examiner

*Primary Examiner* — Angel Roman
(74) *Attorney, Agent, or Firm* — Lexyoume IP Meister, PLLC.

(57) ABSTRACT

A method for fabricating a carbon nanotube film floating on a bottom is provided. The fabrication method of a carbon nanotube film comprises: forming electrodes on a substrate; arranging a suspension comprising a plurality of carbon nanotubes on the electrodes; and arranging the carbon nanotubes on the electrodes by applying a voltage to the electrodes.

12 Claims, 14 Drawing Sheets

FABRICATION METHOD OF CARBON NANOTUBE FILM AND SENSOR BASED ON CARBON NANOTUBE FILM

CROSS-REFERENCE TO RELATED APPLICATION

This application claims priority to and the benefit of Korean Patent Application No. 10-2010-0074182 filed in the Korean Intellectual Property Office on Jul. 30, 2010, the entire contents of which are incorporated herein by reference.

BACKGROUND OF THE INVENTION (a) Field of the Invention

The present invention relates to a carbon nanotube film, and more particularly, to a method for fabricating a carbon nanotube film floating on a bottom, and a sensor based on the carbon nanotube film.

(b) Description of the Related Art

A carbon nanotube is a new tubular material having hexagons of six carbons connected with one another into the form of a tube, which has superior electrical conductivity and thermal conductivity, as well as high strength.

The carbon nanotube has highly sensitive electrical properties, and therefore is applicable to sensors for the detection of various materials, such as chemical gas molecules and biological molecules, using these properties. Concretely, various sensors using carbon nanotube films are used to detect DNAm protein, bacteria, gas molecules, etc.

A sensor using carbon nanotubes may be formed of nanotubes or a nanotube network. Particularly with a sensor formed of a nanotube network, the signal-to-noise ratio (SNR) and the detection range of materials can be improved, and the sensor can be easily applied to a variety of devices.

Meanwhile, in the case of the sensor using carbon nanotubes where the carbon nanotubes are disposed on the bottom surface of a substrate, etc. with a convection velocity close to zero, the mass transport of a target material to be detected towards the surfaces of the carbon nanotubes becomes inefficient, thus limiting the improvement of sensitivity and response time of the sensor. Moreover, the performance of the sensor depends upon the conditions of the surface of the substrate, for example, electrification of the surface, chemical species, functional groups, and so on.

A recent research reported that the sensitivity and response time of a carbon nanotube sensor can be improved by forming the sensor to float on the bottom surface of a substrate, etc. The carbon nanotubes floating on the bottom has a binding surface 2 times or more larger than in the conventional art, and increases the convection and diffusional flow of a target material towards the carbon nanotubes. For example, carbon nanotubes floating 12.5 μm on the bottom show a rate of bond formation about 2.6 times higher than in the conventional art.

However, it is difficult to align the carbon nanotubes efficiently by the method of fabrication for a carbon nanotube film floating on a bottom, which is known from the prior art, and the fabrication process can be complicated because the process is incompatible. Moreover, it is difficult to control the density of the carbon nanotubes, and a film patterning process is required.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to solve the above problems and provides a method for fabricating a carbon nanotube film floating on a bottom in a simple and efficient manner.

Furthermore, the present invention provides a sensor based on a carbon nanotube film floating on a bottom to efficiently detect a target material.

An exemplary embodiment of the present invention provides a fabrication method of a carbon nanotube film, the method comprising: forming electrodes on a substrate; arranging a suspension comprising a plurality of carbon nanotubes on the electrodes; and arranging the carbon nanotubes on the electrodes by applying a voltage to the electrodes.

The electrodes may be formed of at least one pair of cantilever electrodes spaced apart from each other, and the carbon nanotubes may be arranged between the at least one pair of cantilever electrodes.

A groove may be formed in a portion of the substrate corresponding to the portion of the electrodes where the carbon nanotubes are arranged.

The carbon nanotubes may be formed of a carbon nanotube network.

The forming of the electrodes may comprise: depositing silicon nitride on the substrate; patterning a metal on the silicon nitride; patterning a cantilever array; etching the silicon nitride located under the cantilever array; and forming a photoresist to protect the electrodes.

The metal to be patterned on the silicon nitride may comprise gold.

The patterning of the metal may be performed by a lift-off process.

The patterning of the cantilever array may be performed by reactive ion etching (RIE).

The suspension may be formed by neutralizing and ultrasonicating an acid solution comprising carbon nanotubes.

The acid solution may be prepared by mixing sulfuric acid and nitric acid in a ratio of 3:1.

The voltage applied to the electrodes may be an AC voltage.

An exemplary embodiment of the present invention provides a sensor based on a carbon nanotube film, the sensor comprising: a substrate provided with a groove; a pair of electrodes formed across the groove on the substrate, and having gaps formed in the corresponding portions of the groove; and a carbon nanotube film formed in the gaps and connecting the pair of electrodes.

The carbon nanotube film may comprise a carboxyl group (—COOH).

The pair of electrodes may comprise gold.

According to an exemplary embodiment of the present invention, a carbon nanotube film can be fabricated in a simple manner.

Moreover, the density, size, etc. of the carbon nanotube film can be easily controlled in the fabrication process.

In addition, response time and sensitivity can be improved by using the sensor based on the carbon nanotubes floating on the bottom.

DETAILED DESCRIPTION OF THE EMBODIMENTS

Figure 1:
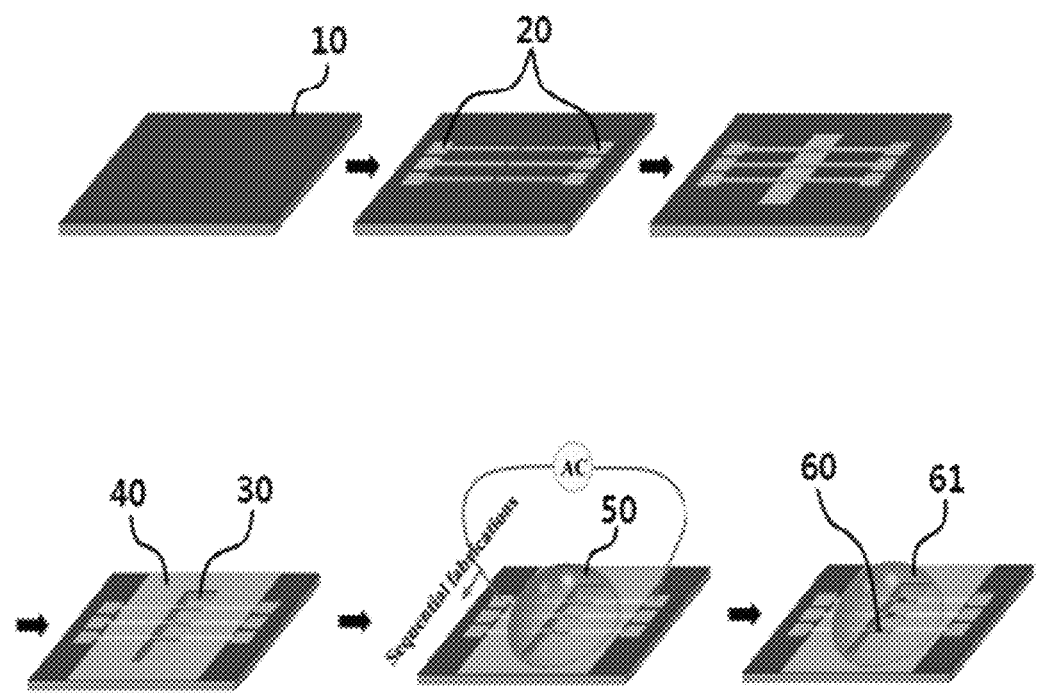
FIG. 1 is a schematic view sequentially showing a fabrication method of a carbon nanotube film according to an exemplary embodiment of the present invention.

Hereinafter, an exemplary embodiment of the invention will be described in detail with reference to the attached drawings such that the invention can be easily put into practice by those skilled in the art.

Elements not relevant to the descriptions will be omitted for clarity, and the same reference numerals will be used throughout the specification to designate the same or like elements.

Figure 2:
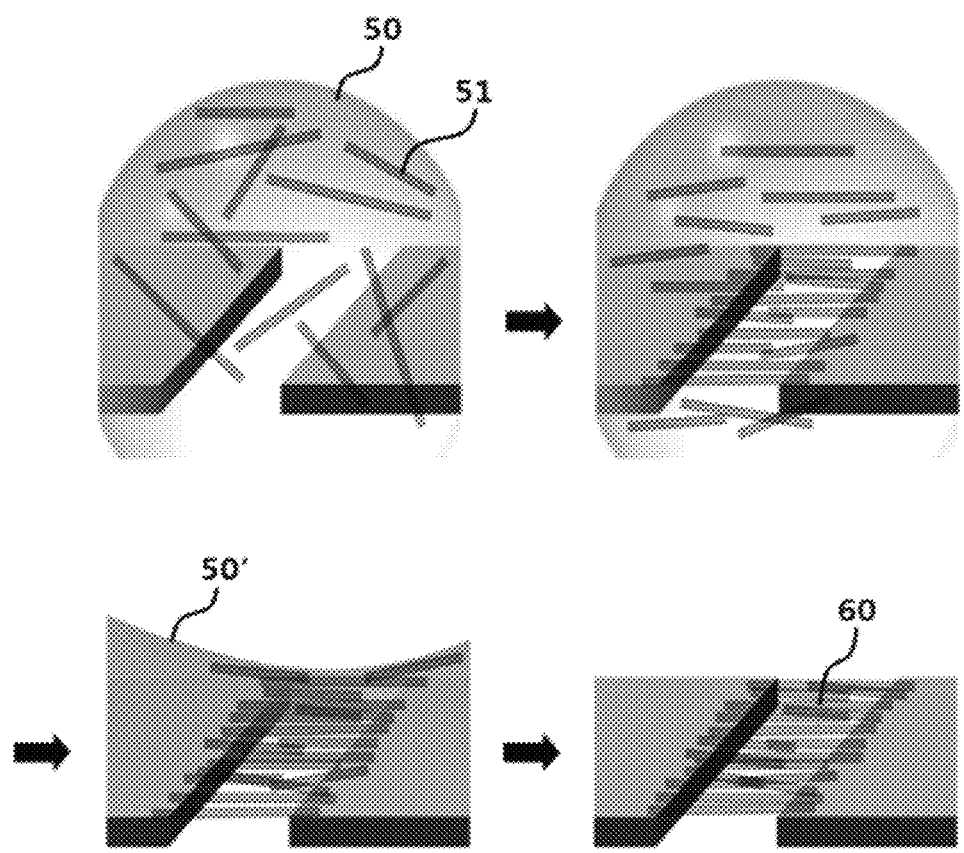
FIG. 2 is an enlarged view of a portion where a carbon nanotube film is formed according to an exemplary embodiment of the present invention.
Figure 3:
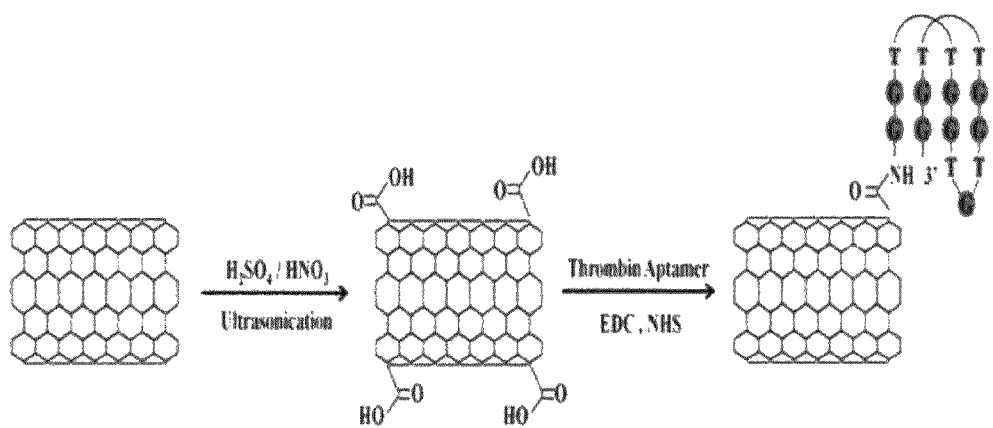
FIG. 3 is a schematic view of a carbon nanotube film according to an exemplary embodiment of the present invention.

FIG. 1 is a schematic view sequentially showing a fabrication method of a carbon nanotube film according to an exemplary embodiment of the present invention. FIG. 2 is an enlarged view of a portion where a carbon nanotube film is formed according to an exemplary embodiment of the present invention. FIG. 3 is a schematic view of a carbon nanotube film according to an exemplary embodiment of the present invention.

Referring to FIG. 1, the fabrication method of a carbon nanotube film according to an exemplary embodiment of the present invention comprises the step of forming electrodes 20 on a substrate 10, the step of arranging a carbon nanotube suspension 50 comprising a plurality of carbon nanotubes 51 on the electrodes 20, and the step of arranging the carbon nanotubes 51 on the electrodes 20 by applying a voltage to the electrodes 20. The present exemplary embodiment will be described with respect to an example in which the carbon nanotube film is a single-walled carbon nanotube (SWNT).

In the present exemplary embodiment, the electrodes 20 are formed of cantilever electrodes 20, which are implemented by a MEMS (micro electric mechanical system) process.

In order to fabricate the carbon nanotube film, low stress silicon nitride is deposited on a silicon wafer used as the substrate 10. The silicon nitride is deposited to electrically insulate the substrate and form the cantilever structure to be described later. The silicon nitride can be deposited by low-pressure chemical vapor deposition (LPCVD).

The electrodes 20 are patterned on the surface of the substrate 10 on which the silicon nitride is deposited. The electrodes 20 are formed by forming an alloy of gold (Au) having high electrical conductivity and chrome (Cr) by a lift-off process, and then patterning a cantilever array by reactive ion etching (RIE). That is, the electrodes 20 are made of a material having high electrical conductivity, and formed in the shape of a cantilever with a gap at the center in order to form a carbon nanotube film later. The material of the electrodes 20 may vary from process to process.

A groove 30 is formed below the thus-formed cantilever electrodes 20 so that the cantilever electrodes 20 float on the bottom surface of the substrate 10. Isotropic wet etching is used to form the groove 30 below the electrodes 20.

Afterwards, a passivation film 40 is formed on the electrodes 20 to protect the electrodes 20. Epoxy-type SU8 or the like can be used as the passivation film 40. By the way, the passivation film is not formed on the cantilever array in order to expose the carbon nanotube film to the target material after the formation of the carbon nanotube film.

After thusly forming the electrodes 20 on the substrate 10, the carbon nanotube suspension 50 comprising the carbon nanotubes 51 is dropped onto the electrodes 20 and arranged thereon.

Referring to FIG. 3, in order to form the carbon nanotube suspension 50, carboxylated single-walled carbon nanotubes (COOH-SWNT) are formed by acidifying and ultrasonicating the single-walled carbon nanotubes. Concretely, the single-walled carbon nanotubes are made to float in a mixed acid solution of $H_2SO_4$ and $HNO_3$, and then ultrasonicated. Thereafter, the carbon nanotube suspension in the acid solution is diluted with distilled water and centrifugated. After the centrifugation, materials floating on the surface of the acid solution are removed, and diluted again with distilled water, which is repeated until the acid solution is neutralized. Once the acid solution is neutralized by repeating the above steps, the carbon nanotubes are dispersed in the neutral solution by ultrasonication, thus forming the carbon nanotube suspension 50.

Referring again to FIG. 1 and FIG. 2, using the thus-formed carbon nanotube suspension 50, a carbon nanotube film is formed by dielectrophoresis (DEP) and the surface tension of water meniscus.

To this end, first of all, the carbon nanotube suspension 50 is arranged on the cantilever electrodes 20 and then a voltage is applied to both ends of the electrodes 20. The voltage used is an AC voltage. When the voltage is applied, the carbon nanotubes 51 are gathered and aligned in gaps formed between the cantilever electrodes 20.

As shown in FIG. 2, if the carbon nanotube suspension 50 is removed, the remaining suspension forms water meniscus 50' between the electrodes 20. The carbon nanotubes 51 gathered in the gaps between the electrodes 20 are compressed by the surface tension of the water meniscus 50', and attached to the electrodes 20 by Van der Waals forces. As a result, a carbon nanotube film 60 floating on the bottom surface of the substrate 10 is formed between the electrodes 20.

In this manner, the carbon nanotube film floating on the bottom can be formed in a simple manner by using the MEMS process, dielectrophoresis, and surface tension. According to the present exemplary embodiment, the density of the carbon nanotubes in the carbon nanotube film can be controlled easily by the amplitude and frequency of the AC voltage applied to the electrode, the concentration and current application time of the suspension comprising the carbon nanotubes, and so on. In addition, the size, etc. of the carbon nanotube film is determined by the width of the cantilever electrodes or the gaps therebetween.

According to the present exemplary embodiment, it is possible to form a finer carbon nanotube film 60 by using the property that the carbon nanotubes 51 are gathered only in the gaps between the electrodes 20 applied with a voltage. Therefore, a carbon nanotube film with various compositions can be formed at a specific position, thus enabling the fabrication of a carbon nanotube film with various functions on a single chip.

Moreover, an aptamer 61 for detecting a target material using the carbon nanotubes can be immobilized to the carbon nanotubes. The aptamer, which is an artificial oligonucleotide, has high sensitivity and high degree of binding, and can bind to various target materials such as proteins, cells, and organic molecules. The aptamer is applied to various sensors due to a strong binding force of the aptamer to a target material. In an example, an anti-thrombin DNA aptamer 61 may bind to the carbon nanotubes in order to detect thrombin. Such an anti-thrombin DNA aptamer 61 can strongly bind to the carboxylated carbon nanotubes by covalent binding, which will be described in more detail by experimental examples to be described later.

FIGS. 4a to 4d are photographs showing enlarged views of a carbon nanotube film fabricated by the process according to the present exemplary embodiment.

Figure 4A:
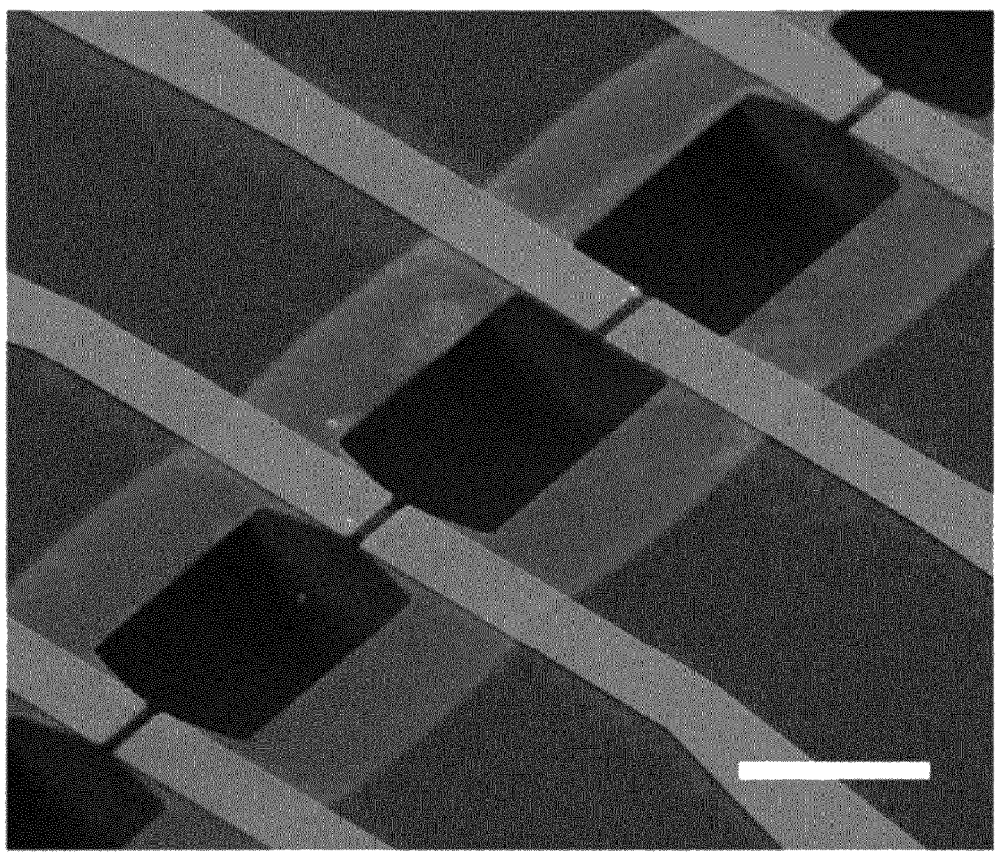
FIGS. 4a to 4d are photographs showing enlarged views of a carbon nanotube film fabricated according to an exemplary embodiment of the present invention.
Figure 4B:
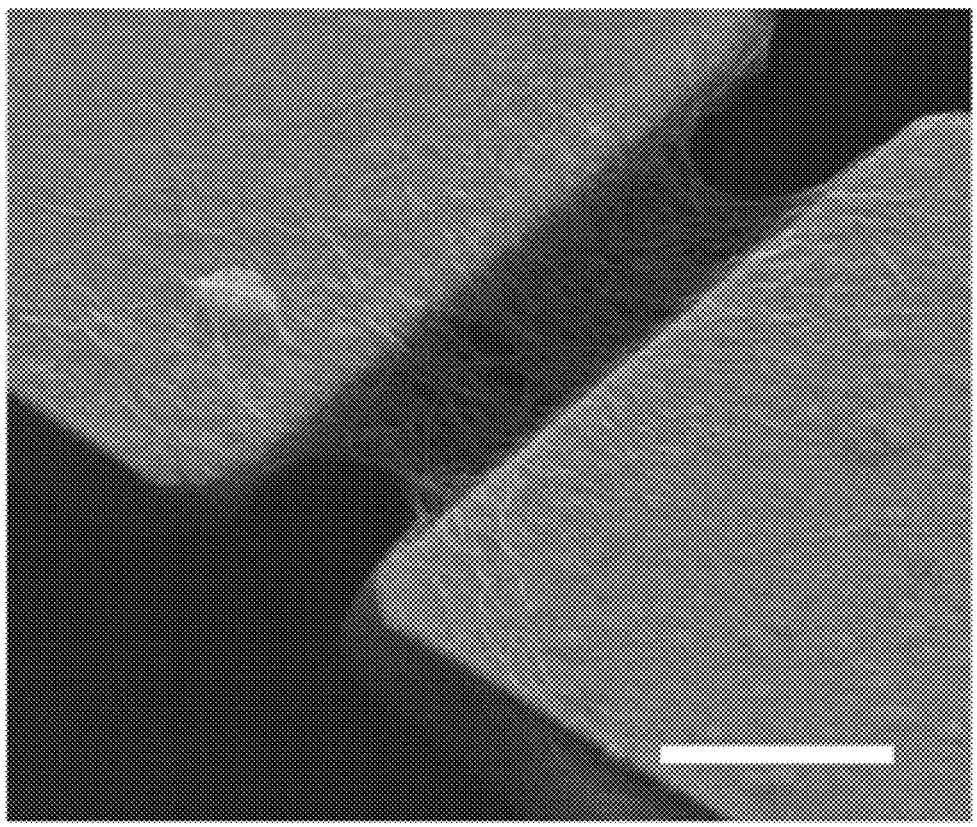

FIG. 4a and FIG. 4b are photographs showing the carbon nanotube film fabricated by the present process at scales of 50 μm and 5 μm, from which it is confirmed that the carbon nanotube film is formed to float on the bottom by aligning the carbon nanotubes between the cantilever electrodes. As such, contact resistance is reduced due to a wide contact area between the carbon nanotube film and the electrodes, and long-term stability is maintained as the carbon nanotube film and the electrodes are physically strongly linked. Moreover, a sensor may be provided with a wide active area by modulating a Schottky barrier between the carbon nanotube film and the electrode.

Figure 4C:
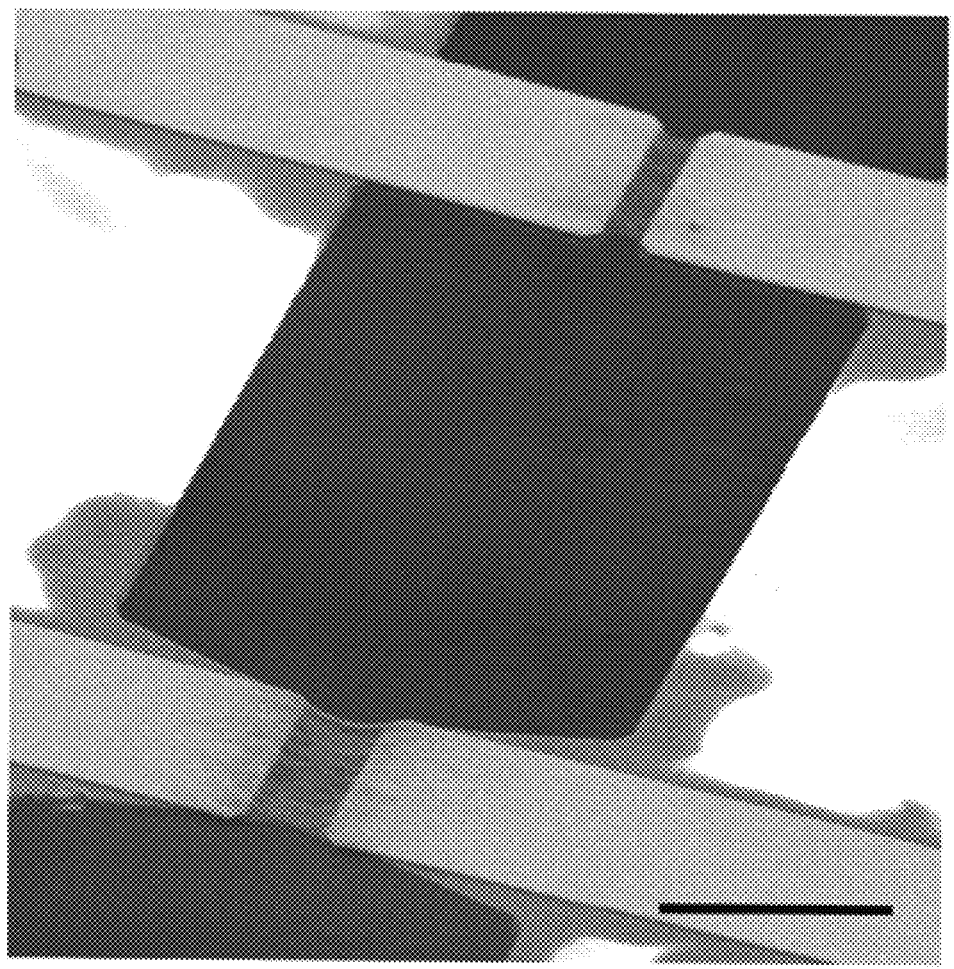
Figure 4D:
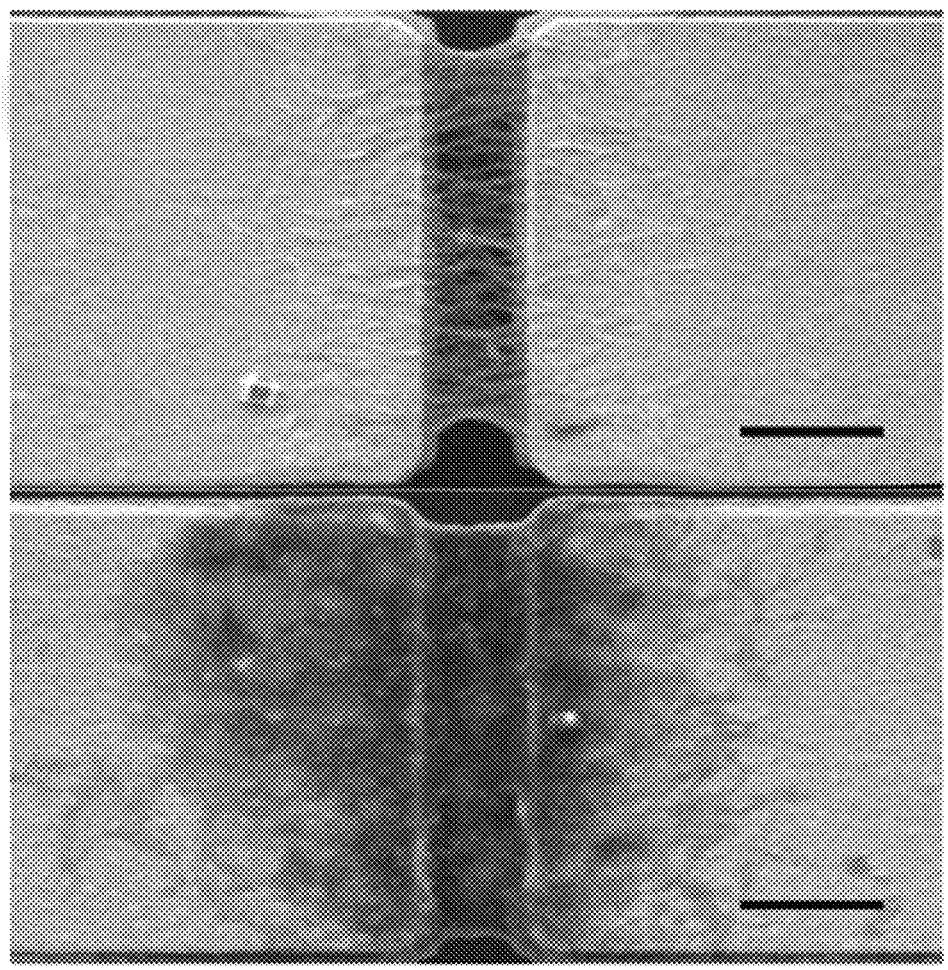

Referring to FIG. 4c, it can be seen that carbon nanotube films of different lengths are formed between neighboring electrodes. According to the present process, the size, etc. of the carbon nanotube films can be easily controlled as described above. FIG. 4d shows the carbon nanotube film before and after a test for detecting thrombin using the carbon nanotube film fabricated according to the present exemplary embodiment, from which it is clear that it is easy to detect a target material using the carbon nanotube film floating on the bottom.

Figure 5:
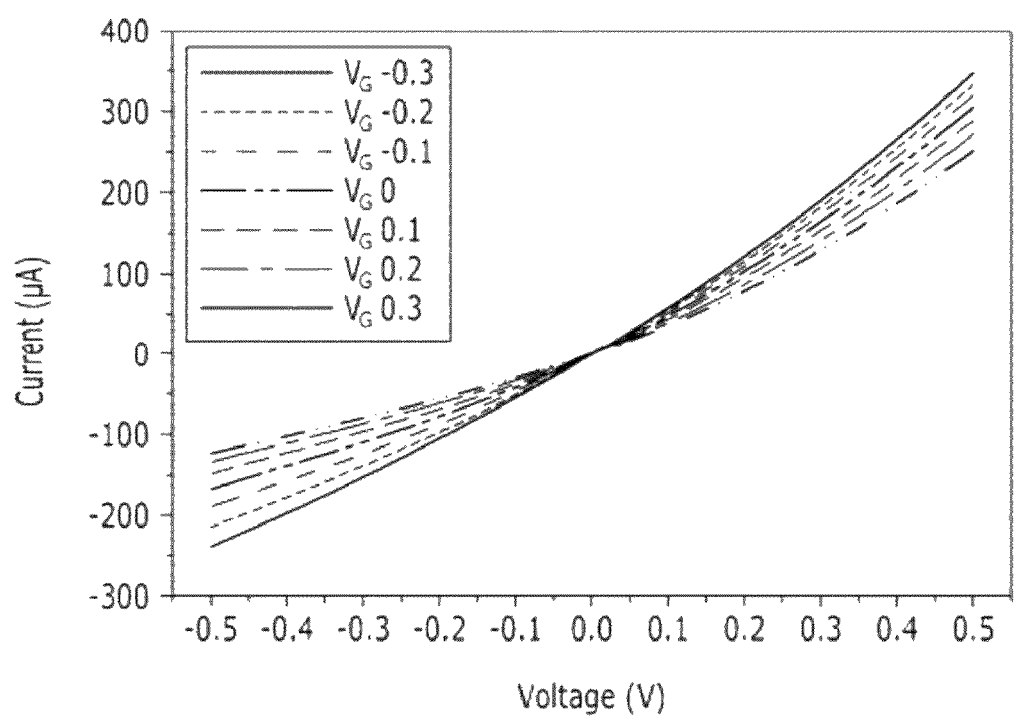
FIG. 5 is a graph showing the electrical properties of the carbon nanotube film according to an exemplary embodiment of the present invention.

FIG. 5 is a graph showing the electrical properties of a carbon nanotube film according to an exemplary embodiment of the present invention. The electrical properties of the carbon nanotube film were measured in real time at ambient temperature by a precision semiconductor analyzer, and shown in a current-voltage (I-V) graph of the carbon nanotube film in a buffer solution of pH 5.6.

Referring to FIG. 5, it is confirmed that the source-drain current decreases as the electrolyte gate bias is increased using a reference electrode. Accordingly, it is clear that the carbon nanotube film floating on the bottom shows p-type in a pure buffer solution.

Hereinafter, the effects of the carbon nanotube film fabricated according to an exemplary embodiment of the present invention will be described in more detail based on the experimental examples of the present invention.

First Experimental Example

Figure 6:
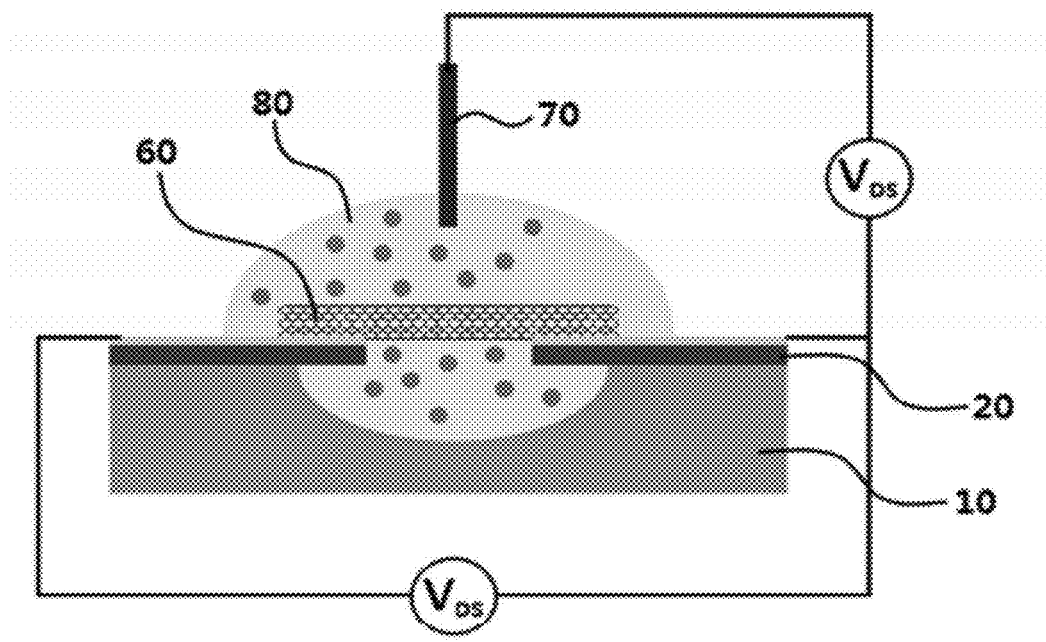
FIG. 6 is a schematic view of a carbon nanotube film sensor for detecting a target material according to an experimental example of the present invention.

FIG. 6 is a schematic view for detecting a target material using a sensor comprising a carbon nanotube film fabricated according to an experimental example of the present invention. The sensor comprises electrodes 20 formed on a substrate 10 and the carbon nanotube film 60. A target material suspension 80 comprising a target material is dropped onto the carbon nanotube film 60, and then an electrolyte gate 70 is linked to the target material suspension 80.

In this experimental example, a carbon nanotube film was fabricated by the process of the above-mentioned exemplary embodiment. Concretely, 1 μm of silicon nitride was deposited on the substrate by low-pressure chemical vapor deposition, and cantilever electrodes were formed of an alloy of gold and chrome by a lift-off process and an ion etching process. A groove was formed below the cantilever electrodes by isotropic wet etching, and a passivation film was formed on the electrodes by using SU8.

To form a carbon nanotube suspension comprising carbon nanotubes, 5 mg of single-walled carbon nanotubes were arranged to float in 50 ml of an acid solution, and then ultrasonicated for 3 hours. The acid solution was prepared by mixing sulfuric acid and nitric acid in a ratio of 3:1. Afterwards, the acid solution was diluted with distilled water and centrifuged for 10 minutes at 12,000 rpm to thus remove floating materials, and diluted again with distilled water to thus form a carbon nanotube suspension.

5 μl of the thus-formed carbon nanotube suspension was arranged on the cantilever electrodes, and an AC voltage having a frequency of 1 MHz and an amplitude of 5V was applied to both ends of the electrodes, thereby forming a carbon nanotube film by dielectrophoresis and water meniscus.

Proteins and DNA may nonspecifically bind to the surface of the carbon nanotubes by π-π stacking interaction. In this experimental example, real-time detection of thrombin was performed by nonspecifically binding the thus-formed carbon nanotube film to thrombin.

10 μl of a buffer solution of pH 5.6 was dropped onto the carbon nanotube film, and 3 μl of a buffer solution and a thrombin solution with a specific concentration were added sequentially to the carbon nanotube film using a micropipette to thus measure the electric conductivity of the carbon nanotube film upon application of a 10 mV bias voltage.

Figure 7A:
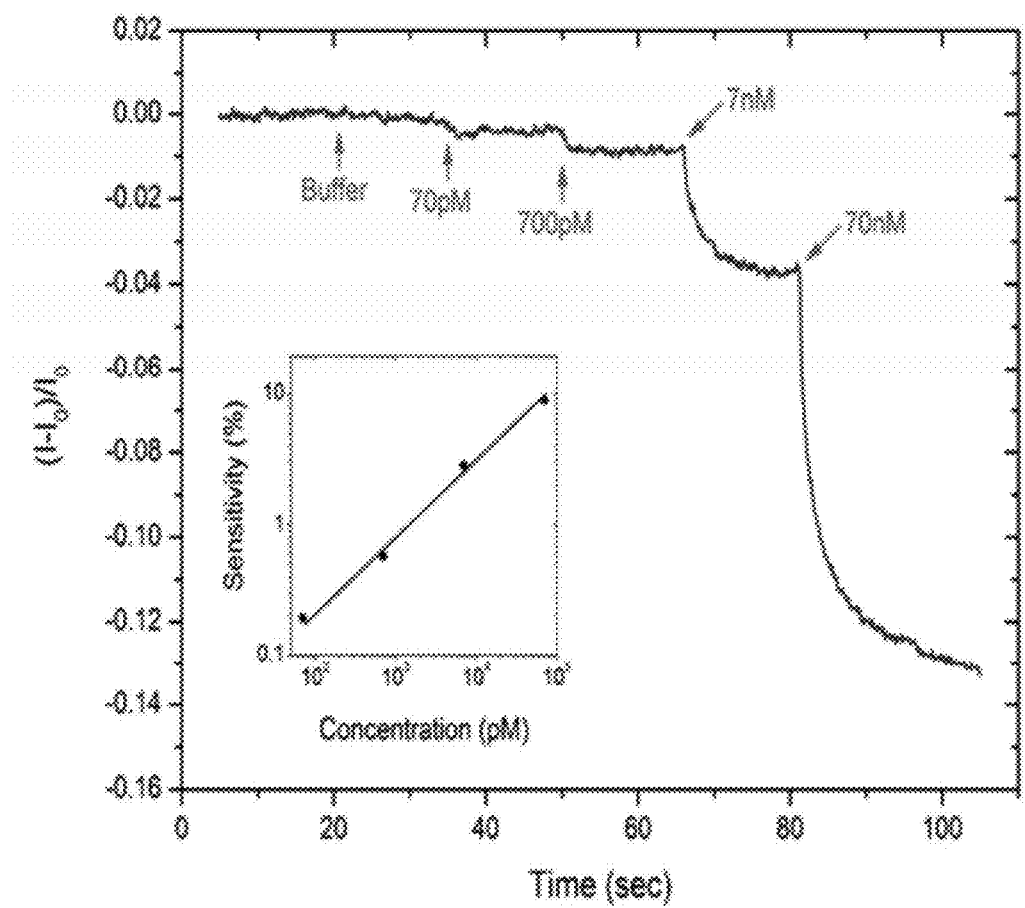
FIGS. 7a to 7e are graphs showing variations in the current of the carbon nanotube film sensor during the detection of a target material according to experimental examples of the present invention.

FIG. 7a shows variations in current with respect to time at varying concentrations of a thrombin solution added according to this experimental example. Referring to this drawing, the sensor of this experimental example showed sensitivity of less than 70 pM and response time of several tens of seconds. Moreover, the conductivity of the sensor linearly decreased as the concentration of the thrombin solution increased from 70 pM to 700 pM.

Second Experimental Example

In this experimental example, a vascular endothelial growth factor (VEGF) was detected in the same manner as the first experimental example. That is, 10 μl of a buffer solution of pH 5.6 was dropped onto the carbon nanotube film, and 3 μl of a buffer solution and a thrombin solution with a specific concentration were added sequentially to the carbon nanotube film to thus measure the electric conductivity of the carbon nanotube film upon application of a 10 mV bias voltage.

Figure 7B:
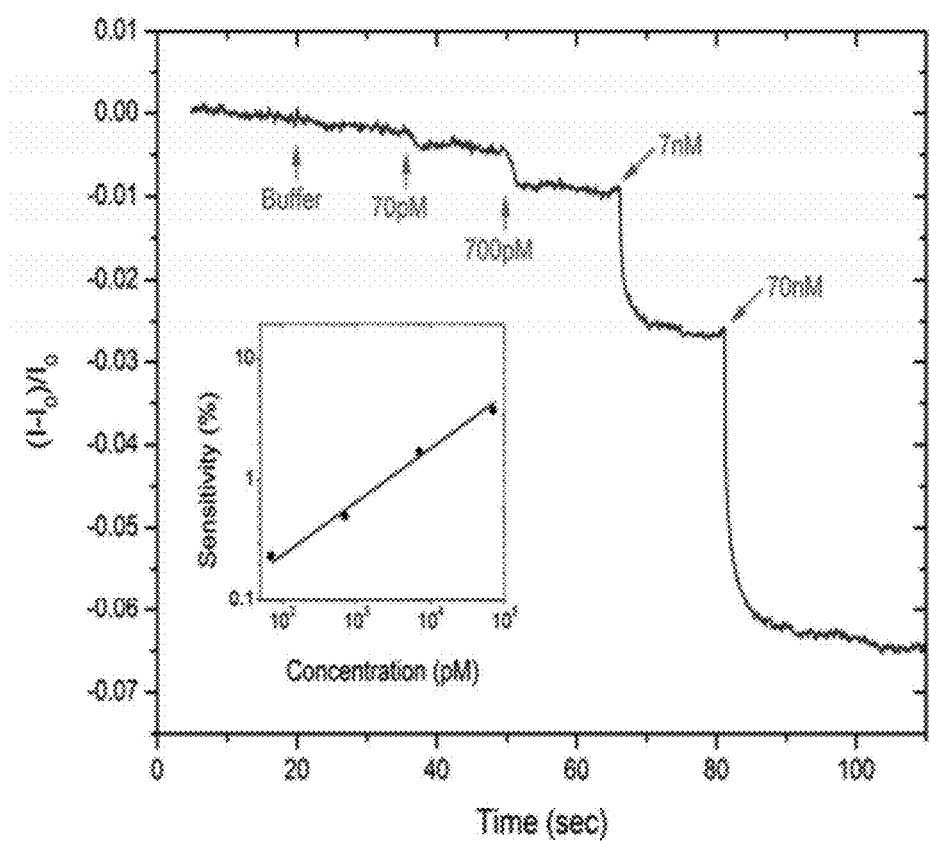
Figure 7C:
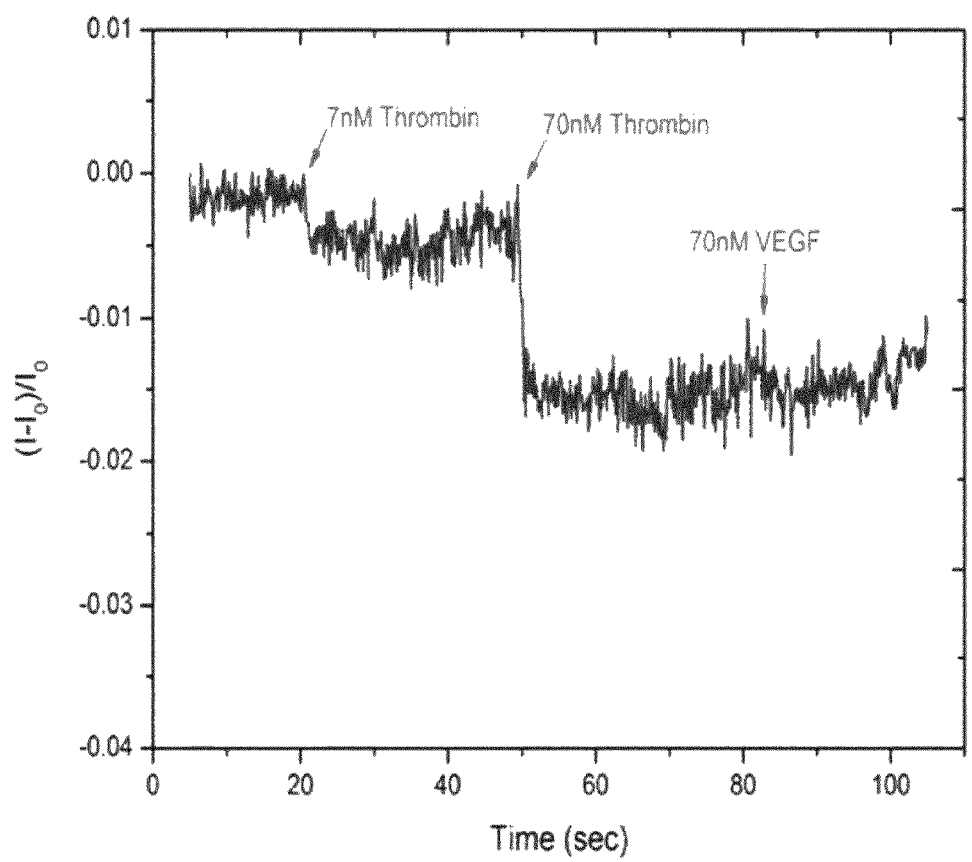

FIG. 7b shows variations in current with respect to time at varying concentrations of a vascular endothelial growth factor solution added according to this experimental example. Referring to this drawing, the sensor of this experimental example showed sensitivity of less than 70 pM and response time of several tens of seconds. Moreover, like the first experimental example, the conductivity of the sensor linearly decreased as the concentration of the vascular endothelial growth factor solution increased from 70 pM to 700 pM.

Third Experimental Example

In this experimental example, thrombin and a vascular endothelial growth factor solution were detected by specific binding using a carbon nanotube film serving as an anti-thrombin aptamer.

For a description of this experimental example, referring again to FIG. 3, an anti-thrombin DNA aptamer with an amine terminal group of 5'-NH2-d(GGTTGGTGTGGT-TGG)-3' was bonded to the carbon nanotubes using an oligonucleotide synthesizer. To this end, first of all, the anti-thrombin aptamer was dissolved in phosphate buffer (pH 8 and 200 mM) to prepare the aptamer solution at a concentration of 20 µM. To achieve strong covalent binding, the carboxylated carbon nanotubes were treated with 10 ml of a phosphate buffer solution and surface-activated by 3.0 mg of EDC and 1.7 mg of sulfo-NHS. Then, the atamer solution and 0.05% of polysorbate-20 were added and incubated at room temperature. The carbon nanotubes coated with polysorbate-20 show very excellent resistance to nonspecific binding of proteins. Then, the exterior of the carbon nanotubes was washed with a phosphate buffer solution to remove the remaining EDC and sulfo-NHS.

Through the above-described process, the anti-thrombin aptamer was covalently bonded to the carbon nanotubes, and then the current of the carbon nanotube film was measured in real time as in the first and second experimental examples.

FIG. 7b shows variations in current with respect to time at varying concentrations of a thrombin solution added according to this experimental example. Referring to this drawing, electric current dropped rapidly upon injection of thrombin, whereas no current drop was observed upon injection of the vascular endothelial growth factor solution. From this result, it is clear that the carbon nanotube film serving as the anti-thrombin selectively binds to thrombin.

Fourth Experimental Example

In this experimental example, the sensitivity of the carbon nanotube film functioning as the anti-thrombin aptamer was measured while varying the concentration of the thrombin solution in a similar manner as the third experimental example.

Figure 7D:
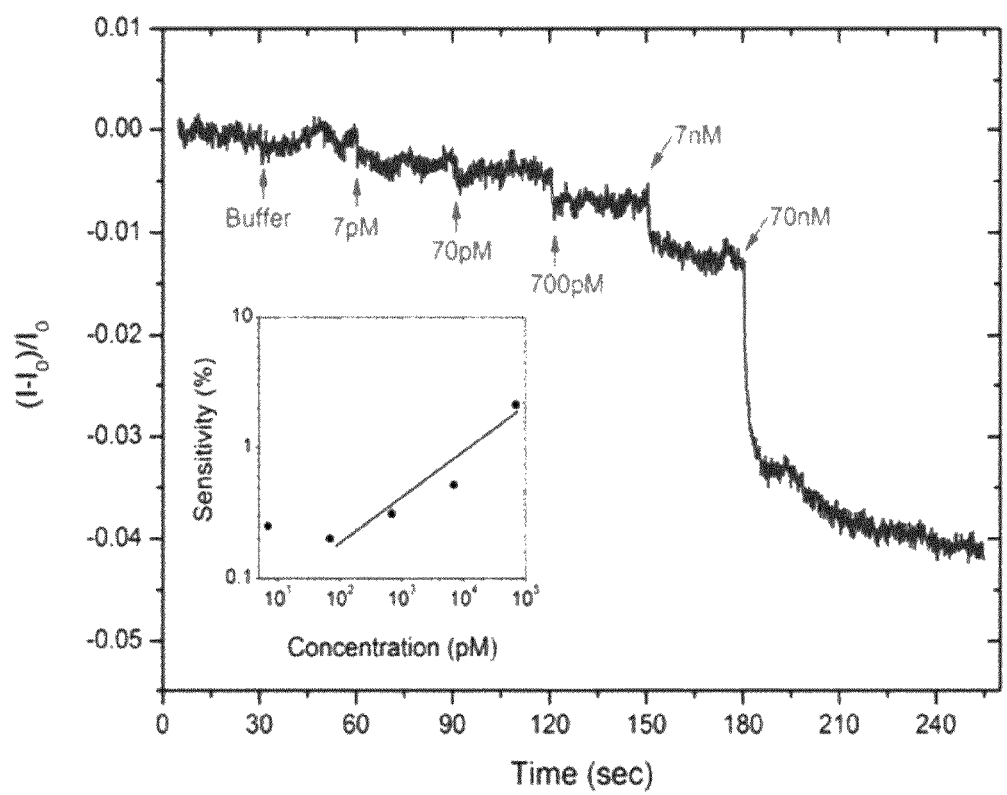

FIG. 7d shows variations in current with respect to time at varying concentrations of a thrombin solution added according to this experimental example. Referring to this drawing, it is confirmed that the current dropped sharply when a buffer solution was added sequentially at the concentrations from 7 pM to 70 nM. Such a current variation can be explained by electrostatic gating, which is induced by the positive charge of thrombin molecules in the buffer solution of less than pH 5.6 and the modulation of the Schottky barrier between the carbon nanotubes and the electrodes, which occurs as the work function locally changes when thrombin is adsorbed to the carbon nanotube film.

According to the above-described first to fourth experimental examples, as shown in the photograph of FIG. 4d, the surface of the carbon nanotube film is covered with thrombin.

Fifth Experimental Example

In this experimental example, 4-nitrophenol was detected in real time by using a carbon nanotube film in a similar manner as the first and second experimental examples. That is, a buffer solution was dropped onto the carbon nanotube film, and the buffer solution and a 4-nitrophenol solution with a specific concentration were added sequentially to the carbon nanotube film to thus measure the current flowing through the carbon nanotube film.

Figure 7E:
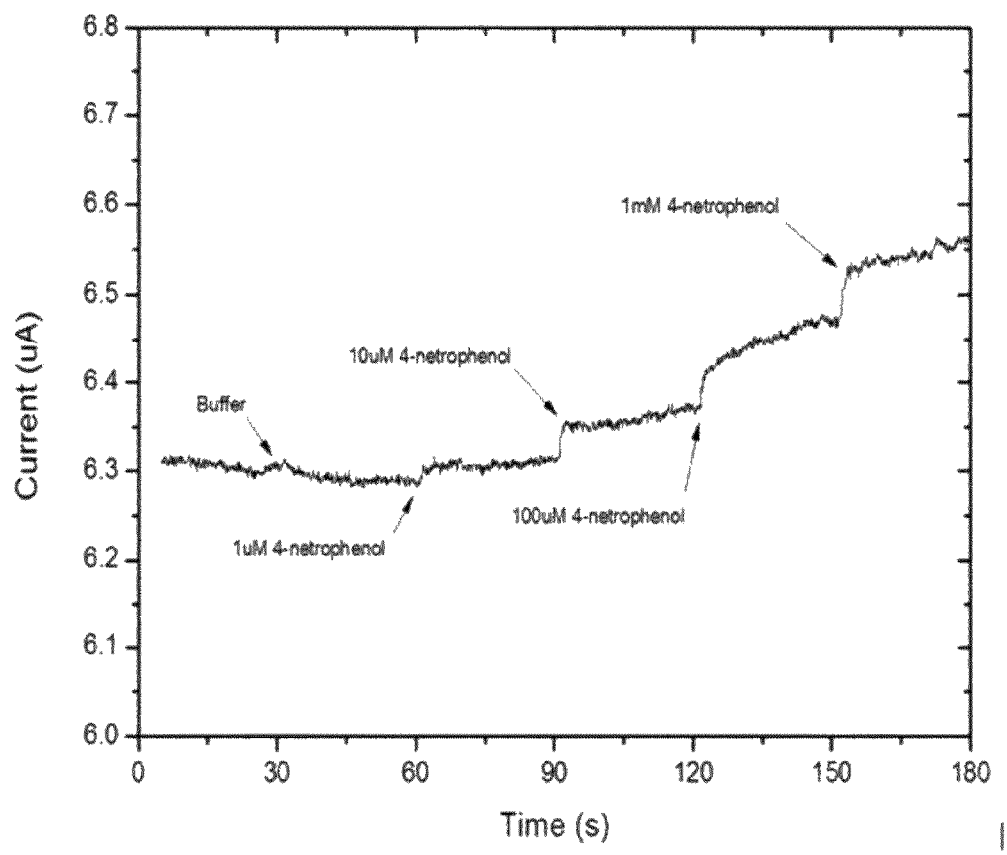

FIG. 7e shows variations in current with respect to time at varying concentrations of a vascular endothelial growth factor solution added according to this experimental example. Referring to this drawing, the current increased sharply when a 4-nitrophenol solution was added. Such a current variation can be explained by electrostatic gating, which is induced by the charge of the nitro group and the modulation of the Schottky barrier between the carbon nanotubes and the electrodes. In this experimental example, the sensor showed sensitivity of less than 1 µM and response time of several tens of seconds.

As described above, the mass transfer of a target material on the surface of the sensor is efficiently achieved through the structure of the carbon nanotube film floating on the bottom, and a region binding to the target material can be extended due to the structure floating on the bottom. Therefore, it can be confirmed from the above experimental examples that the carbon nanotube film according to the present exemplary embodiment shows fast response time and high sensitivity, and the sensitivity of the sensor during the detection of proteins is proportional to the concentration of the proteins.

According to the present exemplary embodiment, a carbon nanotube film having high sensitivity and fast response time and floating on the bottom can be fabricated in a simple manner by dielectrophoresis and water meniscus. Moreover, the response time and detection range can be improved either by nonspecific binding using a carboxylated carbon nanotube film or by specific binding using an anti-thrombin aptamer.

While the invention has been shown and described in conjunction with specific exemplary embodiments, the invention is not limited to these exemplary embodiments. The scope of the invention is intended to be defined in the following appended claims. That is, those skilled in the art will appreciate that various modifications and changes can be made without departing from the concept and scope of the invention.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A fabrication method of a carbon nanotube film, the method comprising:
   forming electrodes on a substrate;
   arranging a suspension comprising a plurality of carbon nanotubes on the electrodes; and
   arranging the carbon nanotubes on the electrodes by applying a voltage to the electrodes,
   wherein the electrodes are formed of at least one pair of cantilever electrodes spaced apart from each other, and the carbon nanotubes are arranged between the at least one pair of cantilever electrodes and
   a groove is formed in a portion of the substrate corresponding to the portion of the electrodes where the carbon nanotubes are arranged.

2. The method of claim 1, wherein the carbon nanotubes are formed of a carbon nanotube network.

3. The method of claim 1, wherein the forming of the electrodes comprises:
   depositing silicon nitride on the substrate;

patterning a metal on the silicon nitride;
patterning a cantilever array;
etching the silicon nitride located under the cantilever array; and
forming a photoresist to protect the electrodes.

4. The method of claim 3, wherein the metal to be patterned on the silicon nitride comprises gold.

5. The method of claim 3, wherein the patterning of the metal is performed by a lift-off process.

6. The method of claim 3, wherein the patterning of the cantilever array is performed by reactive ion etching (RIE).

7. The method of claim 1, wherein the suspension is formed by neutralizing and ultrasonicating an acid solution comprising carbon nanotubes.

8. The method of claim 7, wherein the acid solution is prepared by mixing sulfuric acid and nitric acid in a ratio of 3:1.

9. The method of claim 1, wherein the voltage applied to the electrodes is an AC voltage.

10. A sensor based on a carbon nanotube film, the sensor comprising:
a substrate provided with a groove;
a pair of electrodes formed across the groove on the susbtrate, and having gaps formed in the corresponding portions of the groove; and
a carbon nanotube film formed in the gaps and connecting the pair of electrodes.

11. The sensor of claim 10, wherein the carbon nanotube film comprises a carboxyl group (—COOH).

12. The sensor of claim 10, wherein the pair of electrodes comprises gold.

* * * * *